US012571814B2

(12) United States Patent (10) Patent No.: US 12,571,814 B2
Shirakawa et al. (45) Date of Patent: Mar. 10, 2026

(54) POSITION DETECTION DEVICE

(71) Applicant: Proterial, Ltd., Tokyo (JP)

(72) Inventors: Yohei Shirakawa, Tokyo (JP); Yoshiaki Yanagisawa, Tokyo (JP)

(73) Assignee: Proterial, Ltd., Tokyo (JP)

( * ) Notice: Subject to any disclaimer, the term of this patent is extended or adjusted under 35 U.S.C. 154(b) by 229 days.

(21) Appl. No.: 18/419,329

(22) Filed: Jan. 22, 2024

(65) Prior Publication Data

US 2024/0255539 A1 Aug. 1, 2024

(30) Foreign Application Priority Data

Jan. 27, 2023 (JP) ................................. 2023-010651

(51) Int. Cl.
$G01R\ 27/04$ (2006.01)
$B62D\ 3/12$ (2006.01)
$G01P\ 3/50$ (2006.01)
$G01R\ 33/09$ (2006.01)

(52) U.S. Cl.
CPC ................ *G01P 3/505* (2013.01); *B62D 3/12* (2013.01); *G01R 33/091* (2013.01)

(58) Field of Classification Search
CPC .................................................. G01R 33/091
See application file for complete search history.

(56) References Cited

U.S. PATENT DOCUMENTS

| | | | |
|---|---|---|---|
| 2005/0007108 A1* | 1/2005 | Dogaru | G01N 27/904 |
| | | | 324/754.29 |
| 2008/0028860 A1* | 2/2008 | Refko | G01H 1/16 |
| | | | 73/597 |

FOREIGN PATENT DOCUMENTS

WO 2021/210125 A 10/2021

* cited by examiner

*Primary Examiner* — Alesa Allgood
(74) *Attorney, Agent, or Firm* — Studebaker Brackett PLLC

(57) ABSTRACT

A position detection device for detecting a position of a moving member moving forward and backward in a predetermined moving direction is provided with a detection object attached to the moving member, a substrate provided with an excitation coil for generating a magnetic field in an area including the detection object and a detection coil being interlinked with a magnetic flux of the magnetic field, a power supply unit for supplying an alternating current to the excitation coil, and a calculation unit that calculates the position of the moving member based on an output voltage of the detection coil. The detection coil is shaped as a combination of a pair of curved portions that are symmetrical across a symmetry axis parallel to the moving direction of the moving member. Each of the curved portions is shaped as a sinusoidal fundamental wave component superimposed with a harmonic component of a third or higher order multiplied by each of coefficients corresponding to the order. The coefficients are adjusted in such a manner that a peak value of a voltage induced in the detection coil changes sinusoidally when the detection object moves at a constant speed relative to the substrate while facing a part of the substrate.

5 Claims, 10 Drawing Sheets

————————— SUPPLY VOLTAGE $V_0$

— — — — — INDUCED VOLTAGE $V_1$

—·—·—·—·— INDUCED VOLTAGE $V_2$

POSITION DETECTION DEVICE

CROSS-REFERENCE TO RELATED APPLICATIONS

The present patent application claims the priority of Japanese patent application No. 2023-010651 filed on Jan. 27, 2023, and the entire contents thereof are hereby incorporated by reference.

TECHNICAL FIELD

The present invention relates to a position detection device that detects the position of a moving member that moves forward and backward in a predetermined direction.

BACKGROUND OF THE INVENTION

Conventionally, a position detection device that detects the position of a shaft that moves forward and backward (i.e., reciprocating) in the axial direction is being used, for example, to detect the position of a rack shaft in a steering device of a vehicle.

A detection unit described in Patent Literature 1 detects an axial position of a rack shaft of an electric power steering device and includes a DC power source, a permanent magnet, an element group composed of first to fourth magnetoresistive elements disposed between the permanent magnet and the rack shaft, and a calculation unit for calculating the position of the rack shaft. In the element group, a series circuit including the first and second magnetoresistive elements being connected in series, and a series circuit including the third and fourth magnetoresistive elements being connected in series are connected in parallel to form a bridge circuit. To the calculation unit, a potential of a first terminal connected between the first magnetoresistive element and the second magnetoresistive element and a potential of a terminal connected between the third magnetoresistive element and the fourth magnetoresistive element are input. Plural grooves extending in a direction inclined with respect to the axial direction of the rack shaft are formed on the surface of the rack shaft facing the element group.

In the detection unit configured as described above, when the rack shaft moves in the axial direction due to the rotation of the pinion gear shaft meshing with the rack shaft and the relative positions of the first to fourth magnetoresistive elements with respect to the grooves change, the electric resistance balance of the first to fourth magnetoresistive elements changes, so that the potentials of the first terminal and the second terminal change. The calculation unit calculates the position of the rack shaft based on changes in these potentials.

Citation List Patent Literature 1: WO2021/210125

SUMMARY OF THE INVENTION

In the detection unit disclosed in Patent Literature 1, for example, when the rack shaft moves in a vertical direction (i.e., upward and downward) due to vibrations or the like caused by the running of the vehicle, the position of the first to fourth magnetoresistive elements relative to the grooves changes, and an error will occur in the detected position of the rack shaft.

To develop a position detection device with high detection accuracy, the present inventors initially conceived a position detection device that detects the position of the shaft by arranging a printed circuit board having a detection coil formed by combining a pair of sine wave-shaped conductor wires and a rectangular shape excitation coil formed to surround the detection coil to face the shaft, fixing a target made of an electrically conductive metal to the shaft, and measuring the magnitude of the voltage induced in the detection coil. However, this position detection device has a detection error due to the non-uniformity of the magnetic flux density in the portion of the printed circuit board facing the target.

Accordingly, it is an object of the present invention to provide a position detection device capable of increasing the detection accuracy of the position of a moving member.

To solve the problems mentioned above, the present invention provides: a position detection device for detecting a position of a moving member moving forward and backward in a predetermined moving direction, comprising:

a detection object attached to the moving member;

a substrate provided with an excitation coil for generating a magnetic field in an area including thee detection object, and a detection coil being interlinked with a magnetic flux of the magnetic field;

a power supply unit for supplying an alternating current to the excitation coil; and a calculation unit that calculates the position of the moving member based on an output voltage of the detection coil, wherein the detection coil is shaped as a combination of a pair of curved portions that are symmetrical across a symmetry axis parallel to the moving direction of the moving member, wherein each of the curved portions is shaped as a sinusoidal fundamental wave component superimposed with a harmonic component of a third or higher order multiplied by each of coefficients corresponding to the order, and wherein the coefficients are adjusted in such a manner that a peak value of a voltage induced in the detection coil changes sinusoidally when the detection object moves at a constant speed relative to the substrate while facing a part of the substrate.

Effects of the Invention

According to the position detection device according to the present invention, it is possible to increase the detection accuracy of the position of a moving member.

DETAILED DESCRIPTION OF THE INVENTION

[Embodiment]

Figure 1:
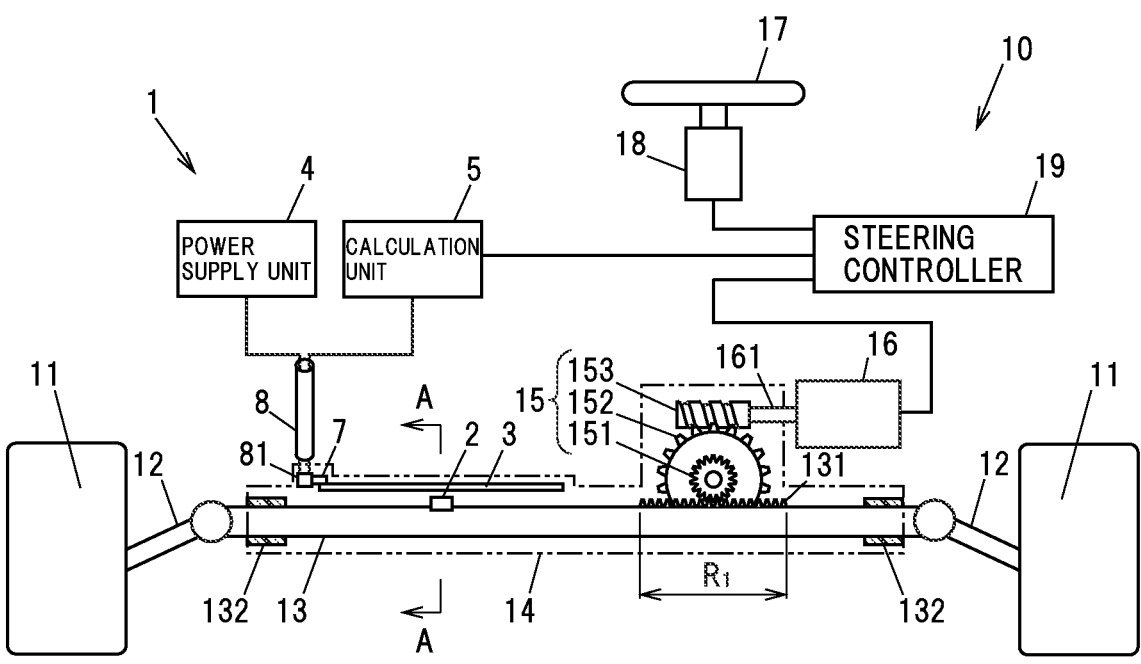
FIG. 1 is a schematic diagram of a vehicle equipped with a steer-by-wire steering device having a stroke sensor as a position detection device, according to an embodiment of the present invention.

FIG. 1 is a schematic diagram of a vehicle equipped with a steer-by-wire steering device 10 having a stroke sensor 1 as a position detection device according to an embodiment of the present invention.

As shown in FIG. 1, the steering device 10 comprises a stroke sensor 1, tie rods 12 connected to steerable wheels 11 (left and right front wheels), a rack shaft 13 connected to the tie rods 12, a cylindrical housing 14 for accommodating the rack shaft 13, a worm reduction mechanism 15 having a pinion gear 151 meshed with a rack teeth 131 of the rack shaft 13, an electric motor 16 that imparts axial movement force to the rack shaft 13 via the worm reduction mechanism 15, a steering wheel 17 to be operated by the driver, a steering angle sensor 18 for detecting a steering angle of the steering wheel 17, and a steering controller 19 for controlling the electric motor 16 based on the steering angle detected by the steering angle sensor 18.

In FIG. 1, the housing 14 is shown in a virtual line (phantom). The rack shaft 13 is supported by a pair of rack bushings 132 attached to both ends of the housing 14. The worm reduction mechanism 15 has a worm wheel 152 and a worm gear 153, and the pinion gear 151 is attached to the worm wheel 152. The worm gear 153 is attached to a motor shaft 161 of the electric motor 16.

The electric motor 16 generates torque by a motor current supplied from the steering controller 19 and rotates the worm wheel 152 and the pinion gear 151 via the worm gear 153. When the pinion gear 151 rotates, the rack shaft 13 moves forward and backward in its axial direction, and the left and right steerable wheels 11 are steered. The rack shaft 13 can move rightward and leftward in a vehicle width direction within a predetermined range from a neutral position when the steering angle is zero. In FIG. 1, a double arrow indicates a range $R_1$ where the rack shaft 13 can move in the axial direction.

(Structure of Stroke Sensor 1)

The stroke sensor 1 includes a target 2 made of an electrically conductive metal as a detection object, a substrate 3 arranged to face the target 2, a power supply unit 4, and a calculation unit 5. The substrate 3 is fixed in the housing 14 parallel to the rack shaft 13. The stroke sensor 1 detects the position of the rack shaft 13 with respect to the housing 14 and outputs information on the detected position to the steering controller 19. The rack shaft 13 is the moving member of the present invention and moves axially forward and backward. The steering controller 19 controls the electric motor 16 in such a manner that the position of the rack shaft 13 detected by the stroke sensor 1 corresponds to the steering angle of the steering wheel 17 detected by the steering angle sensor 18.

Figure 2:
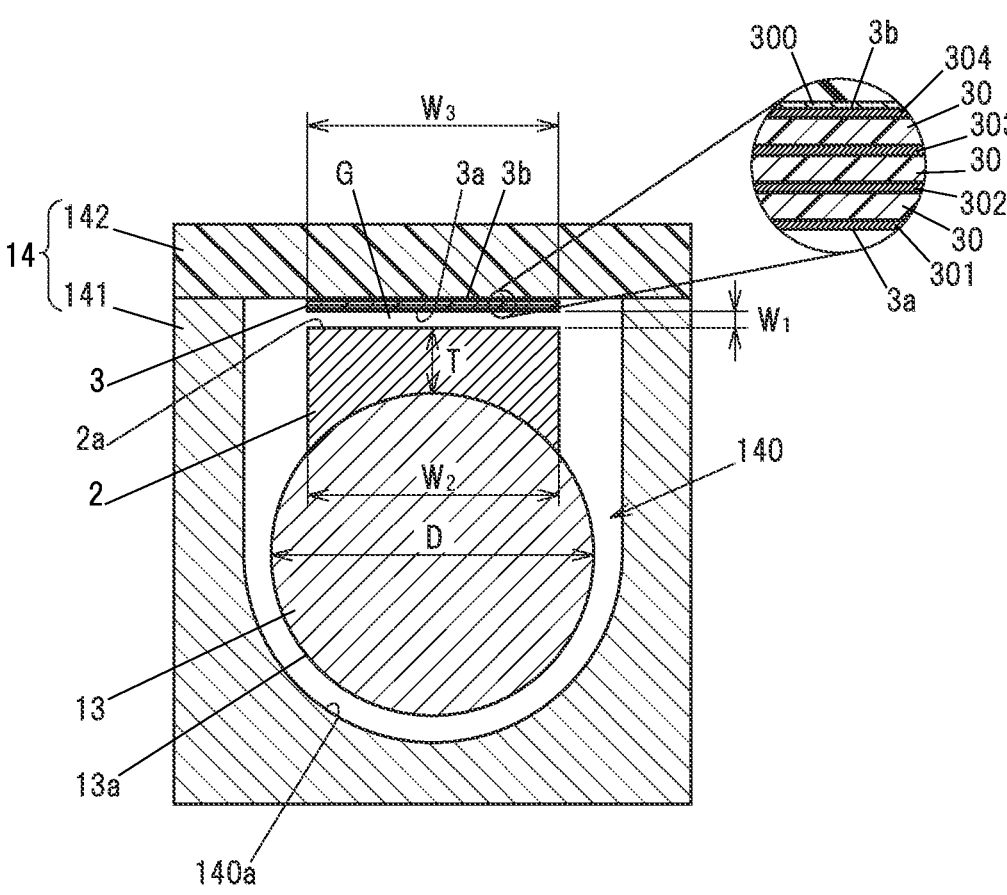
FIG. 2 is a cross-sectional view of a rack shaft, a housing, a target, and a substrate taken along line A-A of FIG. 1.
Figure 3:
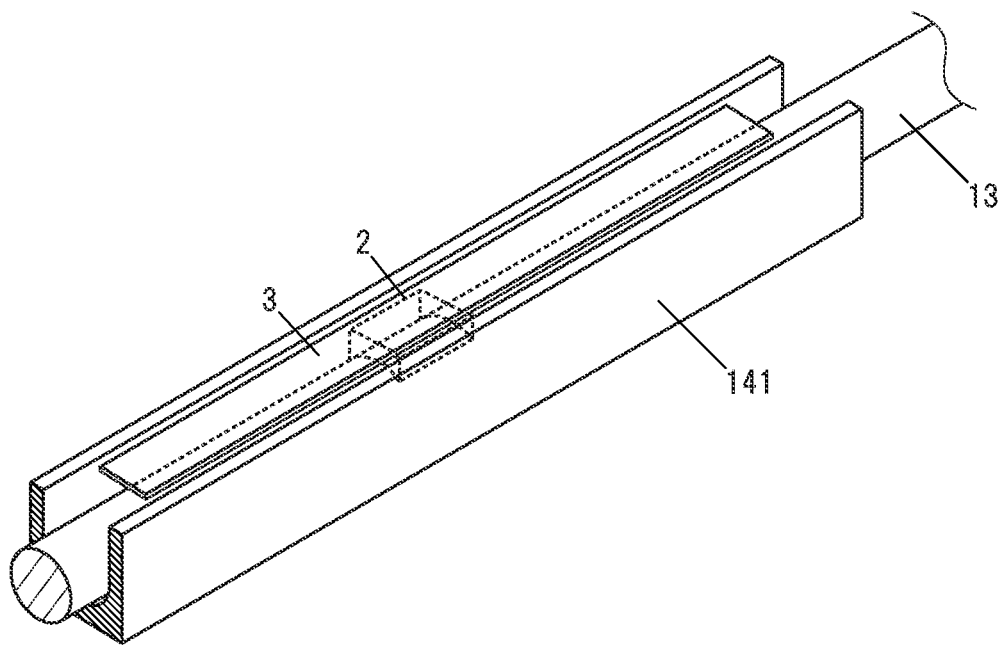
FIG. 3 is a perspective view showing the rack shaft, a main body of the housing, the target, and the substrate.

FIG. 2 is a cross-sectional view of the rack shaft 13, the housing 14, the target 2, and the substrate 3 taken along line A-A in FIG. 1. FIG. 3 is a perspective view showing the rack shaft 13, the main body 141 of the housing 14, the target 2, and the substrate 3.

The rack shaft 13 is a rod-shaped body with a circular cross-section made of steel, such as carbon steel. The housing 14 has the main body 141 made of metal and a lid 142 made of resin, and the lid 142 is attached to the main body 141 by, e.g., adhesion. The main body 141 has a U-shaped cross-section in which an accommodation space 140 for accommodating the rack shaft 13 is formed, and the accommodation space 140 opens upward in the vertical direction. A diameter D of the rack shaft 13 is, e.g., 25 mm.

A gap of, e.g., 1 mm or more is formed between an outer peripheral surface 13a of the rack shaft 13 and an inner surface 140a of the accommodation space 140. The lid 142 is formed in a flat plate shape and covers the accommodation space 140 from above in the vertical direction. The main body 141 is a non-magnetic material made of die-cast aluminum alloy, for example. The material of the lid 142 is not necessarily limited to resin, but it is desirable to use a non-magnetic and non-conductive material.

The target 2 is a target for showing the position of the rack shaft 13 with respect to the stroke sensor 1, and is fixed to an upper part of the rack shaft 13, for example by welding. A facing surface 2a of the target 2, which faces the substrate 3, is formed in a flat plate shape. A non-magnetic metal such as an aluminum alloy or copper, which has a higher conductivity than the rack shaft 13, can be suitably used as the material of the target 2. However, the conductivity of target 2 may be the same as that of rack shaft 13. A protrusion on the rack shaft 13 may also be used as the target 2. The facing surface 2a of the target 2 faces parallel to a front surface 3a of the substrate 3 through an air gap G. A back surface 3b of the substrate 3 is secured to the lid 142 by an adhesive 300.

A width $W_1$ of the air gap G is, e.g., 1 mm. A minimum thickness T of the target 2 in a direction perpendicular to the facing surface 2a is, e.g., 5 mm. In the present embodiment, the rack shaft 13 is formed to have a circular cross-section, but the cross-section of the rack shaft 13 is not limited to a circle but may be in a D-shape in which a part is formed in a straight line or in a polygonal shape.

The substrate 3 is a four-layered substrate in which layers of a plate-shaped base material 30 made of a dielectric material such as FR4 (glass fiber impregnated with epoxy resin and heat-cured) are provided between the first to fourth metal layers 301 to 304. The thickness of each base material 30 is, e.g., 0.3 mm. Each of the first to fourth metal layers 301 to 304 has a thickness of, e.g., 18 μm. The substrate 3 has a flat rectangular shape whose longitudinal direction is the axial direction of the rack shaft 13. A width $W_3$ of the substrate 3 in the shortitudinal direction (lateral direction) is shorter than the diameter D of the rack shaft 13, and is, e.g., 20 mm. A width $W_2$ of the target 2 in the direction parallel to the shortitudinal direction of the substrate 3 is equivalent to the width $W_3$ of the substrate 3 in the shortitudinal direction.

Figures 4A, 4B:
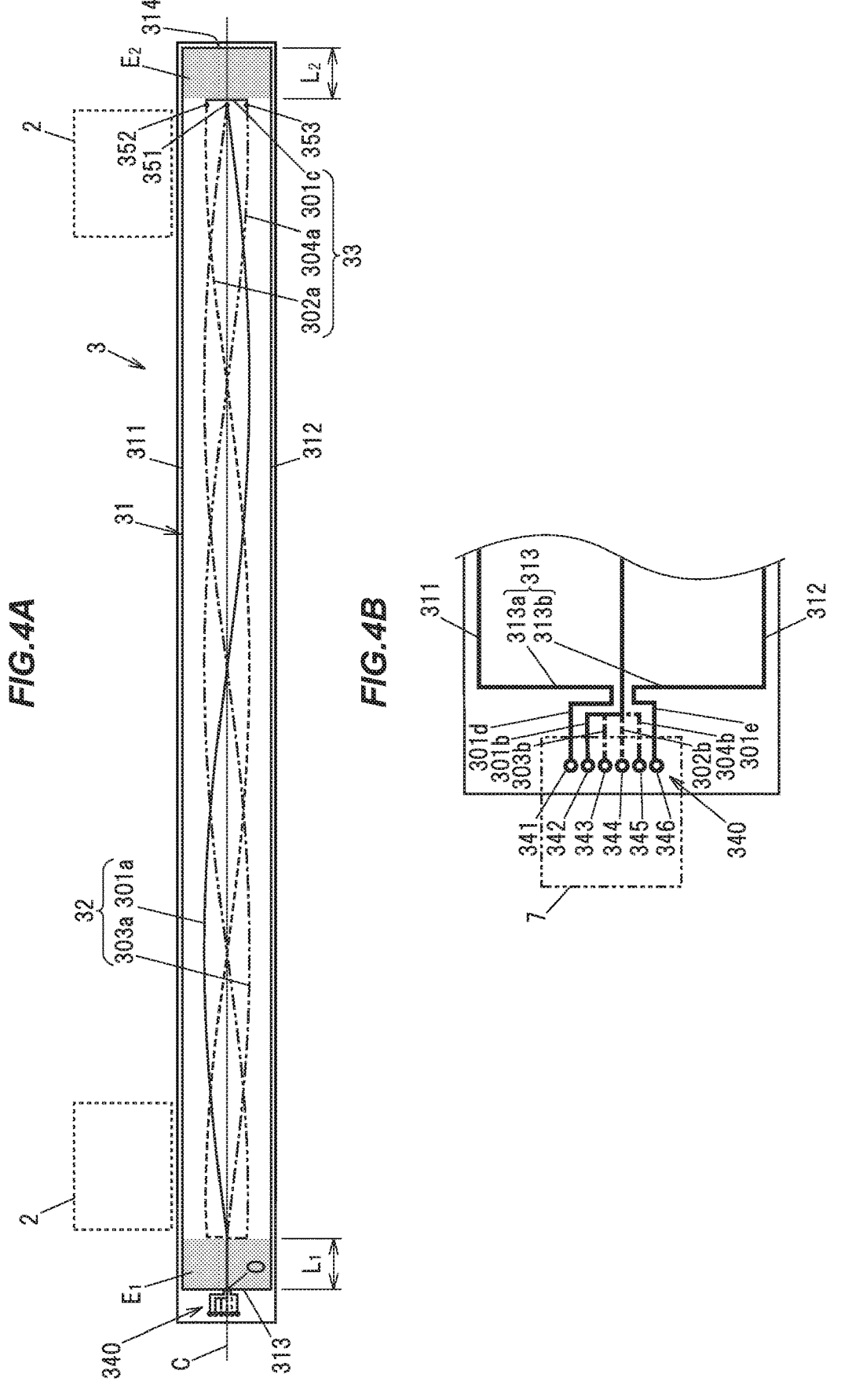
FIG. 4A is an overall view of wiring patterns formed on the first to fourth metal layers of the substrate seen through from a front surface side.
FIG. 4B is a partially enlarged view of FIG. 4A.
Figures 5A, 5B, 5C, 5D:
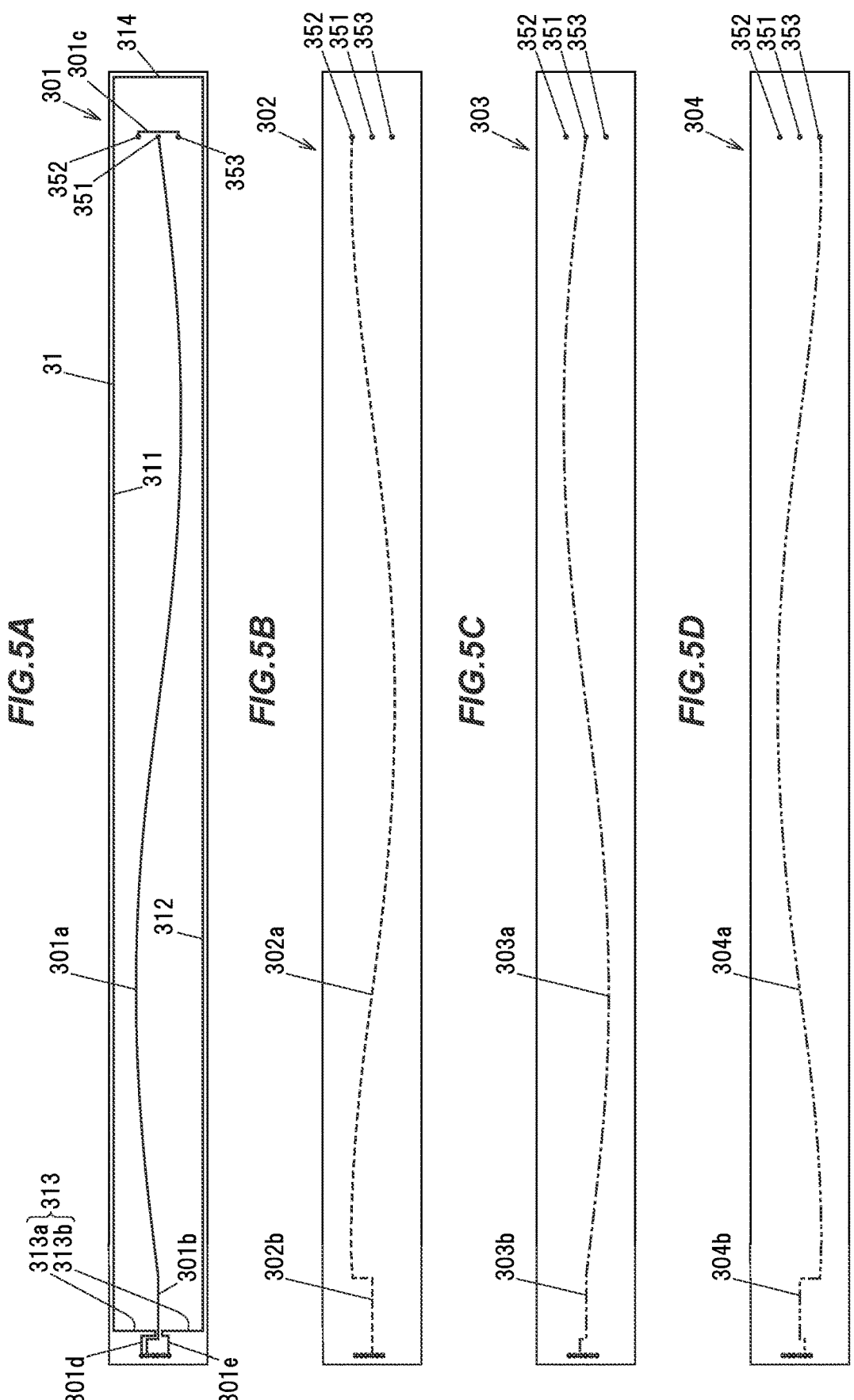
FIGS. 5A to 5D are plan views, respectively showing the first to fourth metal layers viewed from the front surface side.

FIG. 4A is an overall view of the wiring patterns formed on the first to fourth metal layers 301 to 304 of the substrate 3 as seen through from a front surface 3a-side. FIG. 4B is a partially enlarged view of FIG. 4A. FIGS. 5A to 5D are plan views showing the first to fourth metal layers 301 to 304, respectively, viewed from the front surface 3a-side. The wiring patterns shown in FIGS. 4A and 4B and FIGS. 5A to 5D are merely examples, and various wiring patterns may be used as long as the substrate 3 is formed so as to obtain the effects of the present invention.

In FIGS. 4A and FIGS. 5A to 5D, the wiring pattern of the first metal layer 301 is indicated by solid lines, the wiring pattern of the second metal layer 302 is indicated by broken lines, the wiring pattern of the metal layer 303 is indicated by a one-dot chain line, and the wiring pattern of the fourth metal layer 304 is indicated by a two-dot chain line. In FIG. 4A, the substrate 3 is bisected in the shortitudinal direction and the central axis C extending in the longitudinal direction is indicated by a gray straight line, and the dotted lines indicate the positions of the target 2 when the rack shaft 13 is positioned at one end and the other end of the range in which the stroke sensor 1 can detect the absolute position of the rack shaft 13. As shown in FIG. 2, the substrate 3 and the target 2 overlap in the radial direction of the rack shaft 13. However, in FIG. 4A, the position of the target 2 with respect to the substrate 3 is shifted in the shortitudinal direction for the purpose of illustration.

A connector portion 340 having first to sixth through-holes 341 to 346 through which connector pins of the connector 7 indicated by two-dot chain lines in FIG. 4B is provided at one end of the substrate 3 in the longitudinal direction. The first to sixth through-holes 341 to 346 are arranged linearly along the shortitudinal direction of the substrate 3. The connector 7 is connected with a connector 81 (see FIG. 1) of the cable 8 for connection with the power supply unit 4 and the calculation unit 5. Further, the substrate 3 is formed with first to third vias 351 to 353 for connecting the wiring patterns between layers.

The first metal layer 301 includes a first curved portion 301a, a first connector-connecting portion 301b connecting one end of the first curved portion 301a to a second through-hole 342, and an end-connecting portion 301c connecting respective ends of a second curved portion 302a to be described later and a fourth curved portion 304a. The second metal layer 302 includes the second curved portion 302a, and a second connector-connecting portion 302b connecting one end of the second curved portion 302a to a fourth through-hole 344. The third metal layer 303 includes a third curved portion 303a, and a third connector-connecting portion 303b connecting one end of the third curved portion 303a to a third through-hole 343. The fourth metal layer 304 includes a fourth curved portion 304a, and a fourth connector-connecting portion 304b connecting one end of the fourth curved portion 304a to a fifth through-hole 345.

The other ends of the first curved portion 301a and the third curved portion 303a are connected to each other by a first via 351. One end of the end-connecting portion 301c is connected to the other end of the second curved portion 302a by a second via 352, and the other end of the end-connecting portion 301c is connected to the other end of the fourth curved portion 304a by a third via 353.

The first to fourth curved portions 301a, 302a, 303a, and 304a are curved in a substantially sine wave shape. The first curved portion 301a and the third curved portion 303a, and the second curved portion 302a and the fourth curved portion 304a are symmetrical with respect to the central axis C of the substrate 3.

The substrate 3 includes an excitation coil 31 that generates a magnetic field in a range including the target 2, and two detection coils 32 and 33 with which the magnetic flux of the magnetic field generated by the excitation coil 31 interlinks (i.e., chains). Of the two detection coils 32 and 33, one detection coil 32 is formed by the first curved portion 301a and the third curved portion 303a, and the other detection coil 33 is formed by the second curved portion 302a, the fourth curved portion 304a, and the end-connecting portion 301c. The calculation unit 5 determines the position of the rack shaft 13 by calculation using the output voltages of the two detection coils 32 and 33.

The excitation coil 31 has a rectangular shape having a pair of long side portions 311 and 312 extending in the axial direction of the rack shaft 13 and a pair of short side portions 313 and 314 between the pair of long side portions 311 and 312, and the detection coils 32, 33 are formed inside this rectangular-shaped excitation coil 31. The pair of long side portions 311, 312 form the long sides of the rectangular shape, and the pair of short side portions 313, 314 form the short sides of the rectangular shape.

In this embodiment, the long side portions 311 and 312 and the short side portions 313 and 314 are formed as wiring patterns on the first metal layer 301. Of the pair of short side portions 313 and 314, the short side portion 313 on the side of the connector portion 340 is composed of two straight portions 313a and 313b sandwiching the first to fourth connector connection portions 301b, 302b, 303b and 304b. The ends of the two straight portions 313a and 313b are connected to the first through-hole 341 and the sixth through-hole 346 by connector-connecting portions 301d and 301e formed in the first metal layer 301, respectively. The excitation coil 31 may be formed not only on the first metal layer 301 but also on any of the second to fourth metal layers 302 to 304 or may be formed over a plurality of layers.

A sine wave AC current is supplied to the excitation coil 31 from the power supply unit 4. Eddy currents are generated in the target 2 by the magnetic flux generated by the AC current supplied to the excitation coil 31. The magnetic field generated by this eddy current acts to weaken the magnetic field generated by the excitation coil 31, and the magnetic flux density in the part of the substrate 3 facing the target 2 becomes lower than in other parts. Induced voltage is generated in the two detection coils 32 and 33 by the magnetic flux of the magnetic field generated by the excitation coil 31, and the peak value of the voltage induced in the detection coils 32 and 33 varies according to the position of the target 2 relative to the substrate 3. The peak value of the voltage refers to the maximum value of the absolute value of the voltage within a period of one cycle of the alternating current supplied to the excitation coil 31.

The phases of the voltages induced in the detection coils 32 and 33 are different from each other while the rack shaft 13 moves from one movement end in the axial direction to the other movement end in the axial direction. In this embodiment, the phases of the voltages induced in the detection coils 32 and 33 differ by 90°. Hereinafter, of the two detection coils 32 and 33, one detection coil 32 is referred to as a sine wave-shaped detection coil 32, and the other detection coil 33 is referred to as a cosine wave-shaped detection coil 33.

The peak value of the voltage induced in the sine wave-shaped detection coil 32 and the cosine wave-shaped detection coil 33 due to the interlinking of the magnetic flux of the target 2 changes within the range of one cycle or less while the rack shaft 13 moves one movement end to the other movement end in the axial direction. Thereby, the stroke sensor 1 can detect the absolute position of the rack shaft 13 over the entire range $R_1$ in which the rack shaft 13 can move in the axial direction.

As shown in FIG. 4A, between respective ones of the pair of short side portions 313 and 314 of the excitation coil 31, the sine wave-shaped detection coil 32, and the cosine wave-shaped detection coil 33, there are provided first and second buffer regions $E_1$, $E_2$ for suppressing voltages induced in the sine wave-shaped detection coil 32 and the cosine wave-shaped detection coil 33 by the magnetic flux generated by the current flowing through the short side portions 313 and 314. In the example shown in FIG. 4A, a length $L_1$ of the first buffer region $E_1$ and a length $L_2$ of the second buffer region $E_2$ in the longitudinal direction of the substrate 3 are the same, but $L_1$ and $L_2$ may be different from each other.

Next, the operation of the stroke sensor 1 for detecting the position of the target 2 with respect to the substrate 3 will be described with reference to FIGS. 6 to 8. In the following description, the position of the target 2 means the center position of the target 2 in the longitudinal direction of the substrate 3.

Figure 6:
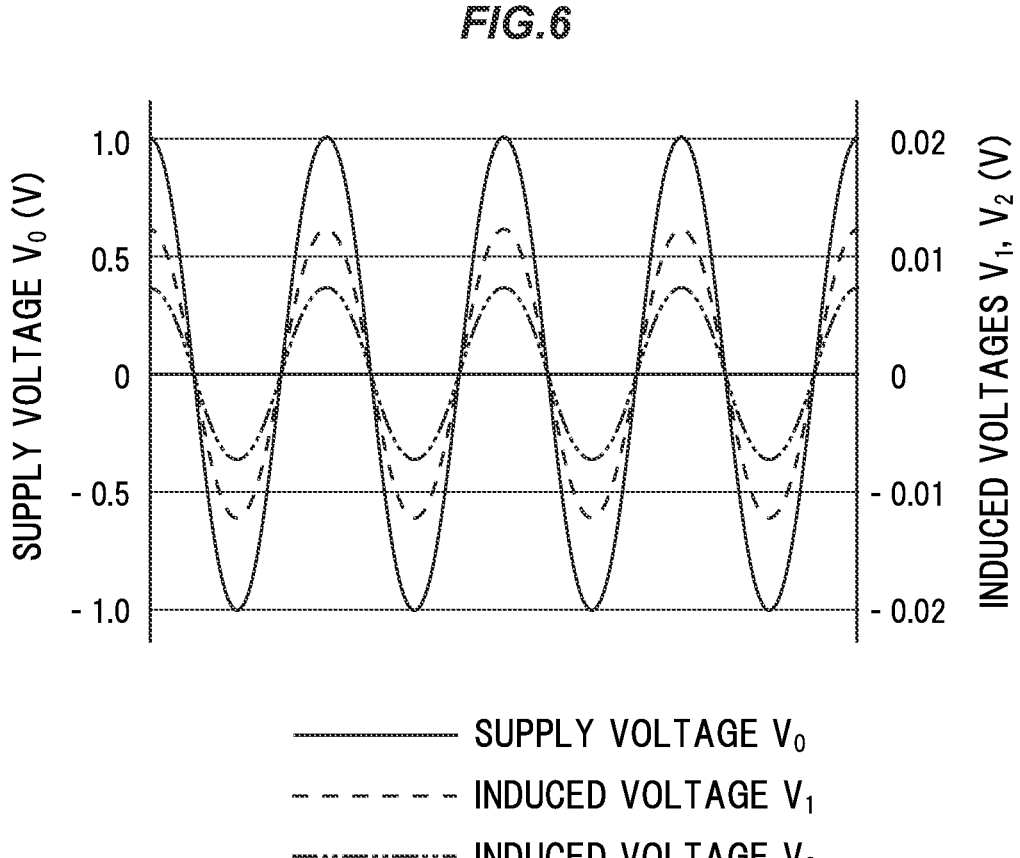
FIG. 6 is a graph showing the relationship between a supply voltage supplied from a power supply unit to an excitation coil, an induced voltage induced in the sine wave-shaped detection coil, and an induced voltage induced in a cosine wave-shaped detection coil.

FIG. 6 is a graph showing the relationship between a supply voltage $V_0$ supplied from the power supply unit 4 to the excitation coil 31, an induced voltage $V_1$ induced in the sine wave-shaped detection coil 32, and an induced voltage $V_2$ induced in the cosine wave-shaped detection coil 33. The horizontal axis of the graph in FIG. 6 is the time axis, and the left and right vertical axes indicate the supply voltage $V_0$ and the induced voltages $V_1$ and $V_2$.

In the example shown in FIG. 6, the supply voltage $V_0$ supplied to the excitation coil 31 and the induced voltages $V_1$ and $V_2$ induced in the sine wave-shaped detection coil 32 and the cosine wave-shaped detection coil 33 are in phase. However, the induced voltage $V_1$ induced in the sine wave-shaped detection coil 32 switches between the in-phase and the reverse phase each time the target 2 passes through the position where the first curved portion 301a and the third curved portion 303a are crossing. In addition, the induced voltage $V_2$ induced in the cosine wave-shaped detection coil 33 switches each time the target 2 passes the position where the second curved portion 302a and the fourth curved portion 304a are crossing. A high-frequency AC voltage of, e.g., about 1 MHz to 1 GHz is supplied to the excitation coil 31 as a supply voltage $V_0$.

Figure 7:
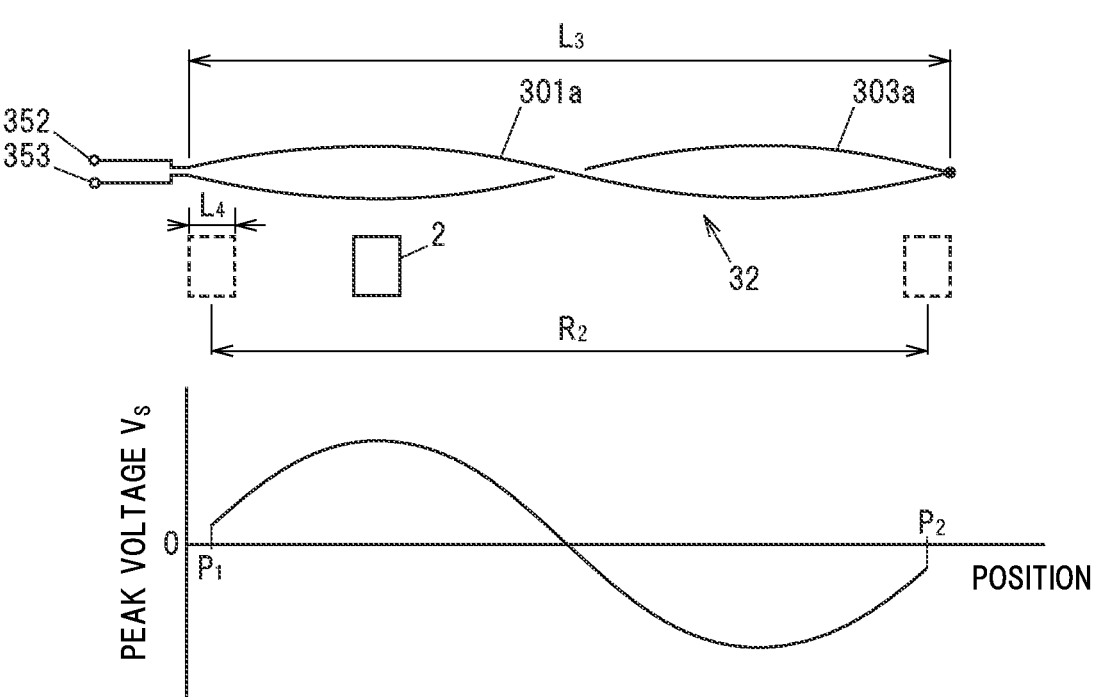
FIG. 7 is an explanatory diagram schematically showing the relationship between a peak voltage, which is a peak value of the induced voltage induced in the sine wave-shaped detection coil, and the position of the target.

FIG. 7 is an explanatory diagram schematically showing the relationship between the peak voltage $V_S$, which is the peak value of the induced voltage $V_1$ induced in the sine wave-shaped detection coil 32, and the position of the target 2. FIG. 8 is an explanatory diagram schematically showing the relationship between the peak voltage $V_C$, which is the peak value of the induced voltage $V_2$ induced in the cosine wave-shaped detection coil 33, and the position of the target 2. In the graphs of the peak voltages $V_S$ and $V_C$ shown in FIGS. 7 and 8, the horizontal axis indicates the position of the target 2.

The stroke sensor 1 can detect an absolute position of the target 2 within an axial range $R_2$ in which the length $L_4$ of the target 2 in the longitudinal direction of the substrate 3 is subtracted from the length $L_3$ of the sine wave-shaped detection coil 32 and the cosine wave-shaped detection coil 33 in the longitudinal direction of the substrate 3. In the graphs shown in FIGS. 7 and 8, the peak voltages $V_S$ and $V_C$ are shown at respective positions where the horizontal axis coordinate when the target 2 is at one end (the end on the side of the connector portion 340) of the axial range $R_2$ is $P_1$, and the horizontal axis coordinate when the target 2 is at the other end of the axial range $R_2$ is $P_2$. The original position of the horizontal axis is the position of the short side portion 313 of the excitation coil 31, indicated by point O in FIG. 4A.

Figure 8:
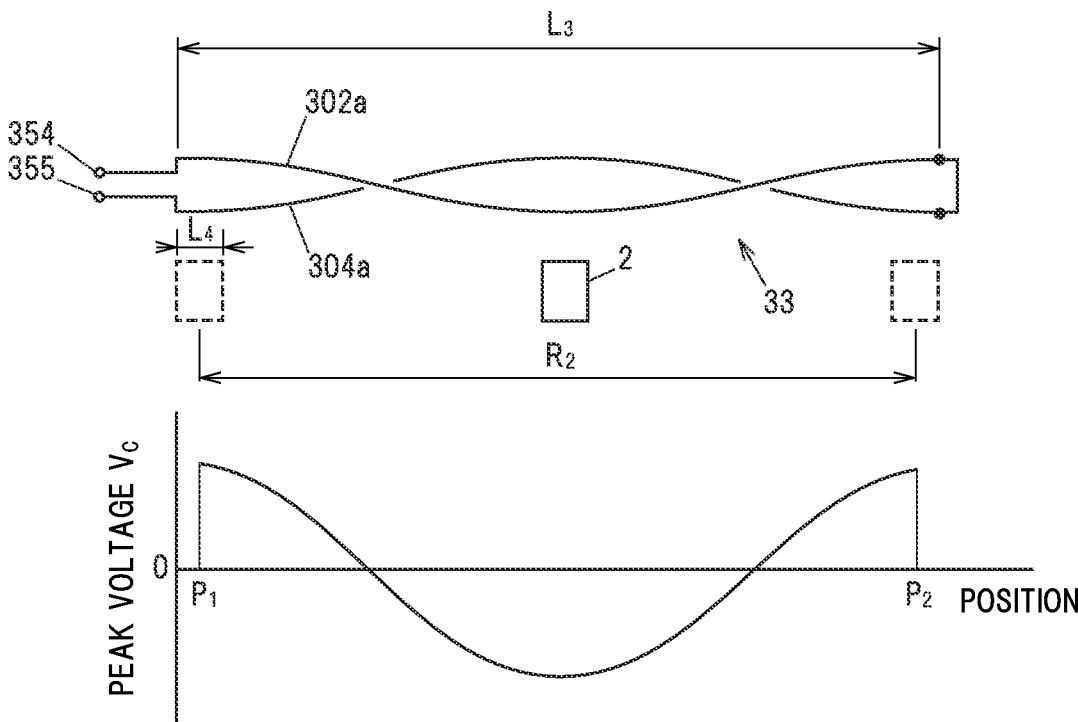
FIG. 8 is an explanatory diagram schematically showing the relationship between a peak voltage, which is a peak value of the induced voltage induced in the cosine wave-shaped detection coil, and the position of the target.

Further, in the graphs shown in FIGS. 7 and 8, the peak voltage $V_S$ of the sine wave-shaped detection coil 32 has a positive value when the induced voltage $V_1$ induced in the sine wave-shaped detection coil 32 is in phase with the supply voltage $V_0$ supplied to the excitation coil 31 and has a negative value when the phase is opposite. Similarly, the peak voltage $V_C$ of the cosine wave-shaped detection coil 33 has a positive value when the induced voltage $V_2$ induced in the cosine wave-shaped detection coil 33 is in phase with the supply voltage $V_0$ supplied to the excitation coil 31, and has a negative value when the phase is opposite.

Here, if cox is defined as in Formula [1], the peak voltages $V_S$ and $V_C$ are obtained by Formula [2] and Formula [3], where Xp is the coordinate value of the horizontal axis of the target 2 in the graphs shown in FIGS. 7 and 8. Note that A in Formula [2] and Formula [3] is a predetermined constant.

[Formula 1]

$$\omega_x = \frac{2\pi}{L_3} \tag{1}$$

[Formula 2]

$$Vs = A\sin\{(\omega_x(X_p - L_1)\} \tag{2}$$

[Formula 3]

$$Vc = A\cos\{(\omega_x(X_p - L_1)\} \tag{3}$$

From Formula [2] and Formula [3], the coordinate value Xp of the target 2 in the graphs shown in FIGS. 7 and 8 is obtained by Formula [4]. That is, the calculation unit 5 can calculate the position of the target 2 based on the peak voltages Vs and Vc.

[Formula 4]

$$X_p = \frac{\arctan\left(\dfrac{Vs}{Vc}\right)}{\omega_x} + L_1 \tag{4}$$

By the way, the magnetic flux density of the part of the substrate 3 facing the target 2 is not uniform and varies depending on the part. This non-uniformity in magnetic flux density causes an error in detecting the position of the rack shaft 13. The magnetic flux density of the portion of the substrate 3 facing the target 2 is described below, and an example of the respective shapes of the sine wave-shaped detection coil 32 and cosine wave-shaped detection coil 33 to reduce detection errors caused by the non-uniformity of the magnetic flux density is described.

Figure 9A:
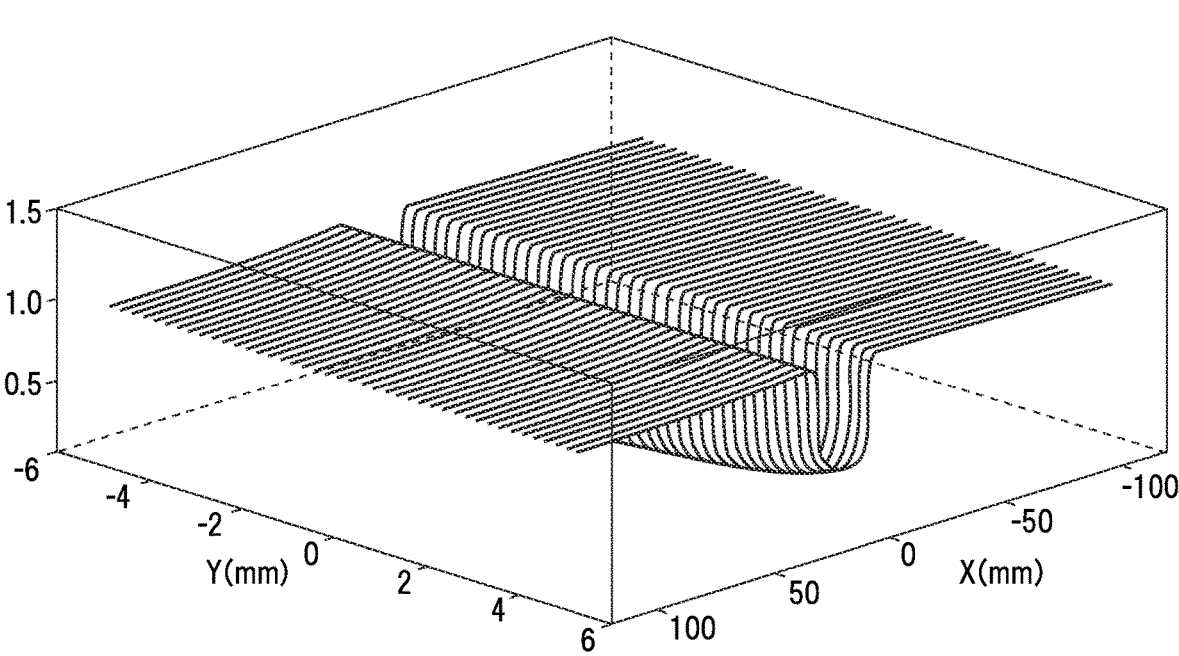
FIG. 9A is a three-dimensional graph showing the distribution of magnetic flux density on the substrate.
Figure 9B:
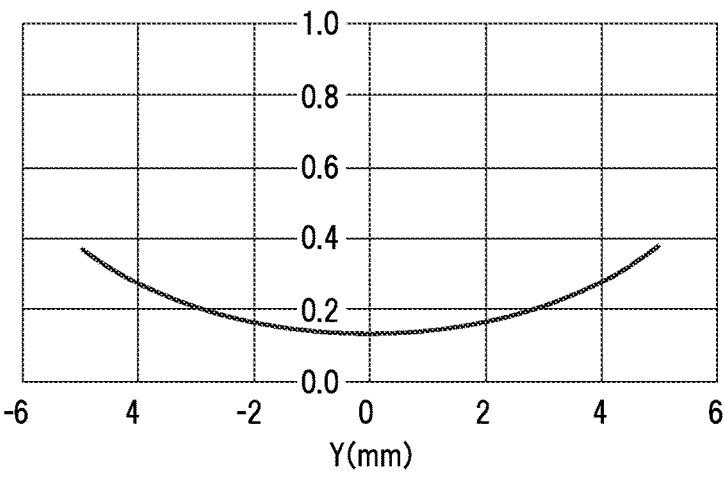
FIG. 9B is a graph showing the distribution of magnetic flux density in a center in a longitudinal direction on the substrate in a portion facing the target in FIG. 9A, with the horizontal axis in a shortitudinal direction of the substrate.

FIG. 9A is a three-dimensional graph showing the distribution of magnetic flux density in the substrate 3. In FIG. 9A, the coordinates of the center of the excitation coil 31 in the longitudinal and shortitudinal directions of the substrate 3 are set to 0, the position in the longitudinal direction of the substrate 3 is shown in X (mm), and the position in the shortitudinal direction of substrate 3 is shown in Y (mm). The vertical axis in FIG. 9A shows the ratio of the magnetic flux density when the target 2 is present to the magnetic flux density when the target 2 is not present. Here, the target 2 is shown in a position facing the center position in the longitudinal direction of the excitation coil 31. FIG. 9B shows the distribution of the magnetic flux density in the center position in the longitudinal direction on the substrate 3 in the part facing the target 2 in FIG. 9A, with the horizontal axis in the shortitudinal direction of the substrate 3.

As shown in FIG. 9A, the magnetic flux density is lower in the part of the substrate 3 facing the target 2 than in other parts. As shown in FIG. 9B, the magnetic flux density decreases significantly in the center in the shortitudinal direction of the substrate 3, and the rate of decrease gradually decreases as one moves away from the center in the shortitudinal direction. This distribution of magnetic flux density is due to the fact that the magnetic field generated by the eddy currents in the target 2 is strongest at the center of the facing surface 2a of the target 2 with the substrate 3. In other words, the intensity of the magnetic field in the portion of the substrate 3 facing the target 2 is weaker than the intensity of the magnetic field in the portion not facing the target 2, and the intensity of the magnetic field in the portion facing the target 2 is weaker in the center in the short side direction of the excitation coil 31 than at both ends in the short side direction.

This non-uniformity in the intensity of the magnetic field in the short side direction affects the peak values of the voltage induced in the sine wave-shaped detection coil 32 and the cosine wave-shaped detection coil 33, and reduces the detection accuracy of the position of the rack shaft 13. Therefore, in the present embodiment, each of the first to fourth curved portions 301a, 302a, 303a, 304a is shaped as a sinusoidal fundamental wave component superimposed with a harmonic component of the third or higher order multiplied by a coefficient corresponding to the order.

When the shapes of the sine wave-shaped detection coil 32 and cosine wave-shaped detection coil 33 are shown as functions in the XY coordinate system, if the lengths of the sine wave-shaped detection coil 32 and cosine wave-shaped detection coil 33 in the longitudinal direction of the substrate 3 are L and ω is defined as in Formula [5], the shape of the sine wave-shaped detection coil 32 can be shown by Formula [6] and the shape of the cosine wave-shaped detection coil 33 can be shown by Formula [7].

[Formula 5]

$$\omega = \frac{2\pi}{L} \qquad [5]$$

-continued

[Formula 6]

$$\pm\left[A\sin(\omega x) + \sum\{ps(n)\sin(n\omega x) + qs(n)\cos(n\omega x)\}\right] \qquad [6]$$

[Formula 7]

$$\pm\left[A\cos(\omega x) + \sum\{pc(n)\sin(n\omega x) + qc(n)\cos(n\omega x)\}\right] \qquad [7]$$

Here, n is the order of harmonics and is a positive integer greater than or equal to 3. ps(n), qs(n), pc(n), and qc(n) are coefficients according to the order n. These coefficients are adjusted in such a manner that the peak value of the voltage induced in the sine wave-shaped detection coil 32 and the cosine wave-shaped detection coil 33 changes sinusoidally when the target 2 moves at a constant speed relative to the substrate 3 while facing a longitudinal part of the substrate 3. More specifically, it is adjusted to mitigate the effect of the non-uniformity of the intensity of the magnetic field in the short side direction of the portion of the substrate 3 facing the target 2 on the peak values of the voltages induced in the sine wave-shaped detection coil 32 and the cosine wave-shaped detection coil 33.

For example, when setting the coefficients (ps(3), ps(4) . . . and qs(3), qs(4) . . . ) to specify the shape of the sine wave-shaped detection coil 32 by Formula [6], first, ps(3) and qs(3), the coefficients of the third harmonic, are determined by electromagnetic field simulation in such a manner that the peak value of the voltage induced in the sine wave-shaped detection coil 32 when the target 2 moves at a constant speed relative to the substrate 3 becomes close to a sine wave. Next, ps(4) and qs(4), the coefficients of the fourth harmonic, are determined in such a manner that the peak value of the voltage induced in the sine wave-shaped detection coil 32 when the target 2 moves at a constant speed relative to the substrate 3 becomes closer to a sine wave. This adjustment of the coefficients is then repeated until the desired detection accuracy is obtained. The coefficients (pc(3), pc(4) . . . and qc(3), qc(4) . . . ) for identifying the shape of the cosine wave-shaped detection coil 33 are also adjusted in the same manner.

Figure 10:
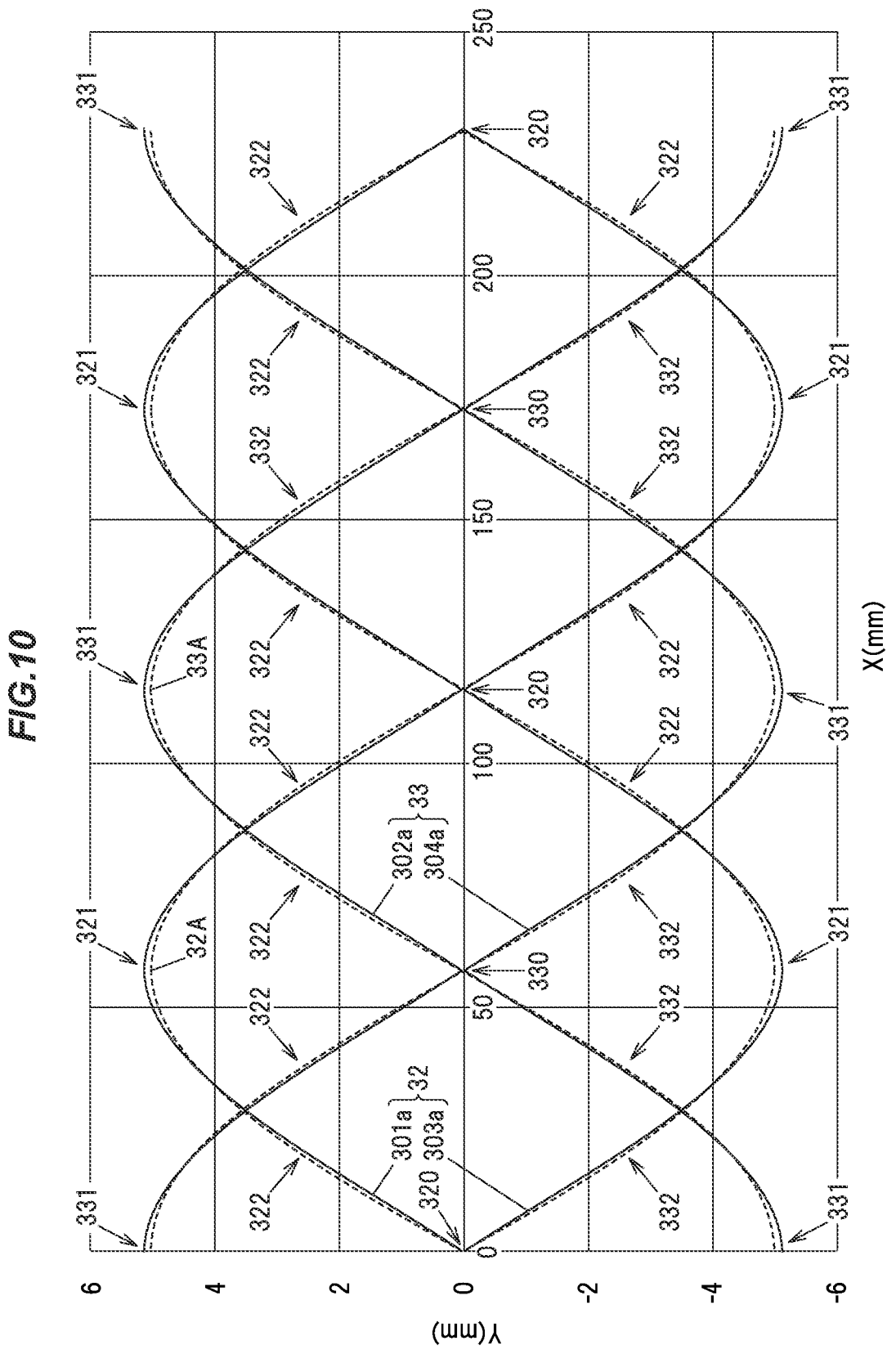
FIG. 10 is a graph showing an example of the shapes of sine wave-shaped detection coils and cosine wave-shaped detection coils with adjusted coefficients of harmonic components in the XY coordinate system.

FIG. 10 is a graph showing an example of the shape of the sine wave-shaped detection coil 32 and the cosine wave-shaped detection coil 33 with the coefficients adjusted in this way in the XY coordinate system. In this graph, the origin of the X-axis is the position of the end of the sine wave-shaped detection coil 32 and the cosine wave-shaped detection coil 33 on one side in the longitudinal direction of the substrate 3, and the origin of the Y-axis is the position of the central axis C of the substrate 3. In FIG. 10, the sine and cosine wave shapes of only fundamental wave components without harmonic components, i.e., a normal (i.e., regular) sine wave-shaped detection coil 32A whose shape is represented by ±A sin(ωX) and a normal (i.e., regular) cosine wave-shaped detection coil 33A whose shape is represented by ±A cos(ωX), are shown as dashed lines as objects for comparison.

As shown in this graph, the sine wave-shaped detection coil 32 protrudes more than the normal sine wave-shaped detection coil 32A at an expanded portion 321, where the absolute value of the Y-axis coordinate is large, and at a middle portion 322 between a zero-crossing position 320 and the expanded portion 321, which intersects the X-axis, the normal sine wave-shaped detection coil 32A is smaller (closer to the X-axis) than the normal sine wave-shaped detection coil 322A. Similarly, the cosine wave-shaped detection coil 33 is larger than the normal cosine wave-shaped detection coil 33A at an expanded portion 331, where the absolute value of the Y-axis coordinate is large, and smaller (closer to the X axis) than the normal cosine wave-shaped detection coil 33A at a middle portion 332 between a zero-crossing position 330 and the expanded portion 331, which crosses the X-axis. (closer to the X-axis).

Figures 11A, 11B, 11C:
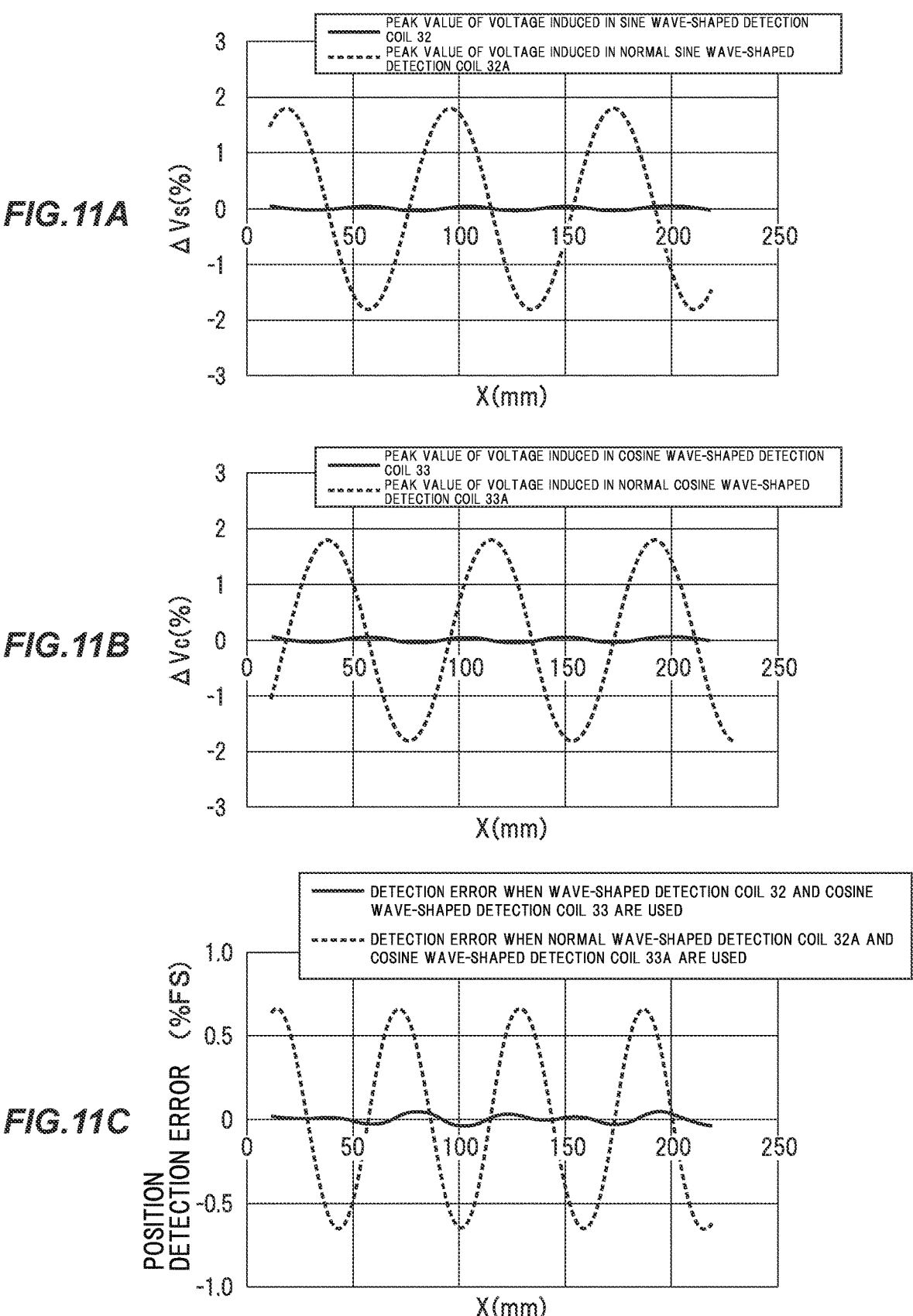
FIG. 11A is a graph showing the relationship between the position of the target and the peak value of the voltage induced in the sine wave-shaped detection coil and the normal sine wave-shaped detection coil.
FIG. 11B is a graph showing the relationship between the position of the target and the peak values of the voltage induced in the cosine wave-shaped detection coil and the normal cosine wave-shaped detection coil.
FIG. 11C is a graph showing the detection error of the target position when using the sine wave-shaped detection coil and the cosine wave-shaped detection coil, and the detection error of the target position when using the normal sine wave-shaped detection coil and the normal cosine wave-shaped detection coil.

FIG. 11A is a graph showing the relationship between the position of the target 2 and the peak value of the voltage induced in the sine wave-shaped detection coil 32 and the normal sine wave-shaped detection coil 32A in the XY coordinate system shown in FIG. 10. The vertical axis of the graph in FIG. 11A shows a percentage of an error amount to an ideal output voltage as $\Delta Vs$ (%), wherein the ideal output voltage is a peak value of the output voltage when the peak value of the output voltage is assumed to vary sinusoidally according to the position of the target 2, and the error amount is a difference between the ideal output voltage and the peak values of the voltages induced in the sine wave-shaped detection coil 32 and the normal sine wave-shaped detection coil 32A.

FIG. 11B is a graph showing the relationship between the position of the target 2 and the peak values of the voltages induced in the cosine wave-shaped detection coil 33 and the normal cosine wave-shaped detection coil 33A in the XY coordinate system shown in FIG. 10. The vertical axis of the graph in FIG. 11B shows a percentage of an error amount to an ideal output voltage as $\Delta Vc$(%), wherein the ideal output voltage is a peak value of the output voltage when the peak value of the output voltage is assumed to vary cosinusoidally according to the position of the target 2, and the error amount is a difference between the ideal output voltage and the peak values of the voltages induced in the cosine wave-shaped detection coil 33 and the normal cosine wave-shaped detection coil 33A.

As shown in the graph in FIG. 11A, the magnitude (absolute value) of $\Delta Vs$ is significantly smaller when the sine wave-shaped detection coil 32 is used, compared to when the normal sine wave-shaped detection coil 32A is used. As shown in the graph in FIG. 11B, when the cosine wave-shaped detection coil 33 is used, the magnitude (absolute value) of $\Delta Vc$ is significantly smaller than when the normal cosine wave-shaped detection coil 33A is used. In the examples shown in FIGS. 11A and 11B, the maximum value of $\Delta Vs$ when using the sine wave-shaped detection coil 32 and the maximum value of $\Delta Vc$ when using the cosine wave-shaped detection coil 33 is 0.027%, respectively, and the maximum value of $\Delta Vs$ when using the normal sine wave-shaped detection coil 32A and the maximum value of $\Delta Vs$ when using the normal cosine wave-shaped detection coil 33A is 1.796%, respectively.

FIG. 11C shows the detection error in the position of the target 2 when using the sine wave-shaped detection coil 32 and the cosine wave-shaped detection coil 33, and the detection error in the position of the target 2 when using the normal sine wave-shaped detection coil 32A and the normal cosine wave-shaped detection coil 33A, in % FS (full scale). The example shown in FIG. 11C is an example of the detection error of the position of the target 2. In the example shown in FIG. 11C, the maximum detection error is 0.04% when using the sine wave-shaped detection coil 32 and the cosine wave-shaped detection coil 33, and the maximum detection error is 0.66% when using the normal sine wave-shaped detection coil 32A and the normal cosine wave-shaped detection coil 33A. Thus, the stroke sensor 1 using the sine wave-shaped detection coil 32 and the cosine wave-shaped detection coil 33 can detect the position of the rack shaft 13 with high accuracy.

[Modified Example]

Figure 12:
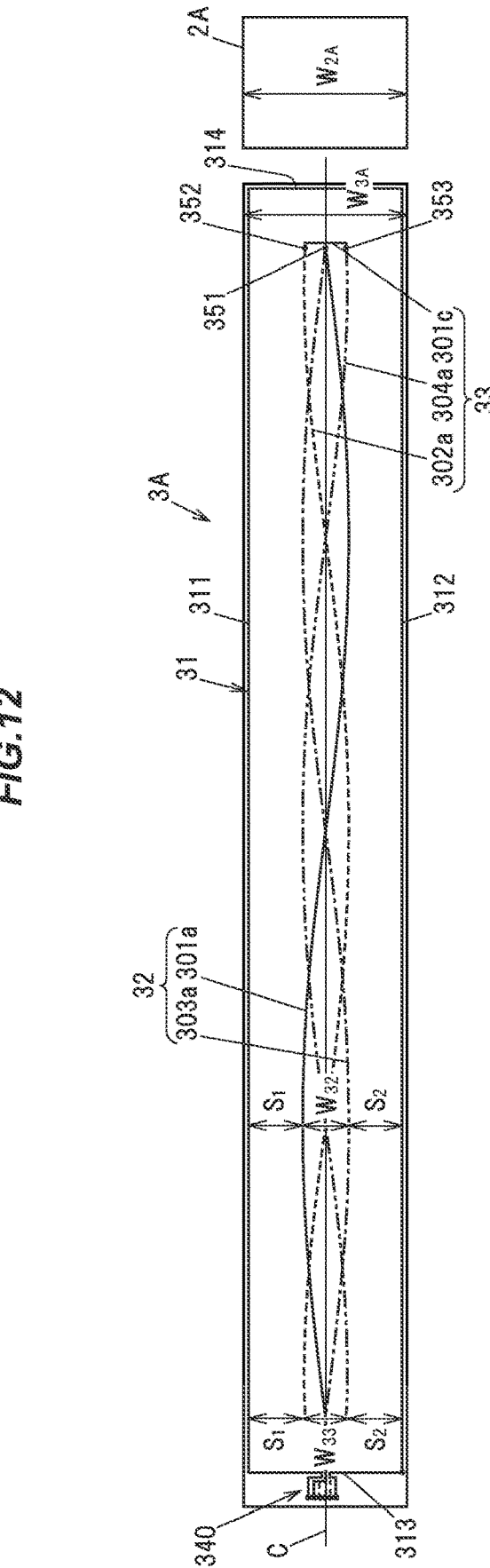
FIG. 12 is a plan view of the substrate in a modified example, together with a target positioned opposite the substrate.

FIG. 12 is a plan view of a substrate 3A in a modified example, together with a target 2A as a detection object disposed to face the substrate 3A. As in the above embodiment, the substrate 3A is flat and rectangular in shape with the axial direction of the rack shaft 13 as the longitudinal direction, and has a rectangular excitation coil 31 having a pair of long side portions 311, 312 and a pair of short side portions 313, 314, a sine wave-shaped detection coil 32 in which the magnetic flux of the magnetic field generated by the excitation coil 31 are interlinking. The distance between each of the pair of long side portions 311, 312 of the excitation coil 31 and the sine wave-shaped detection coil 32 and the cosine wave-shaped detection coil 33 in the short side direction is wider than the width of the sine wave-shaped detection coil 32 and the cosine wave-shaped detection coil 33 in the short side direction. The width of the sine wave-shaped detection coil 32 and the cosine wave-shaped detection coil 33 is wider than the width of the sine wave-shaped detection coil 32 and the cosine wave-shaped detection coil 33 in the short side direction.

As shown in FIG. 12, when the distances between each of the pair of long side portions 311, 312 of the excitation coil 31 and the sine wave-shaped detection coil 32 and the cosine wave-shaped detection coil 33 in the short side direction of the substrate 3A are $S_1$, $S_2$ and the widths of the sine wave-shaped detection coil 32 and the cosine wave-shaped detection coil 33 in the short side direction of the substrate 3A are $W_{32}$ and $W_{33}$, $S_1$ and $S_2$ are wider than $W_{32}$ and $W_{33}$. A width $W_{2A}$ of the target 2A in the direction parallel to the shortitudinal direction of the substrate 3A is equivalent to a width $W_{3A}$ of the substrate 3A in the shortitudinal direction.

When using the substrate 3A and the target 2A in the modified example, the position of the rack shaft 13 can be detected with even higher accuracy because the sine wave-shaped detection coil 32 and the cosine wave-shaped detection coil 33 are formed near the center where the magnetic flux density uniformity in the shortitudinal direction of the substrate 3A in the portion facing the target 2A is high. This makes it possible to detect the position of the rack shaft 13 with even higher accuracy.

(Summary of Embodiment and Modified Example)

Next, technical ideas understood from the embodiment and modified example described above will be described with reference to the reference numerals and the like in the embodiment and example. However, each reference numeral in the following description does not limit the constituent elements in the claims to the members and the like specifically shown in the embodiment and modified example.

According to the first feature, a position detection device (stroke sensor) 1 for detecting a position of a moving member (rack shaft) 13 moving forward and backward in a predetermined moving direction, includes a detection object (targets) 2, 2A attached to the moving member 13, a substrate 3, 3A provided with an excitation coil 31 for generating a magnetic field in an area including the detection object 2, 2A, and a detection coil 32, 33 being interlinked with a magnetic flux of the magnetic field, a power supply unit 4 for supplying an alternating current to the excitation coil 31, and a calculation unit 5 that calculates the position of the moving member 13 based on an output voltage of the detection coil 32, 33, wherein the detection coil 32, 33 is shaped as a combination of a pair of curved portions (first to fourth curved portions) 301a, 302a, 303a, 304a that are symmetrical across a symmetry axis (central axis) C parallel to the moving direction of the moving member 13, and each of the curved portions 301a, 302a, 303a, 304a is shaped as a sinusoidal fundamental wave component superimposed with a harmonic component of the third or higher order multiplied by each of coefficients ps(n), qs(n), pc(n), qc(n) corresponding to the order, and the coefficients ps(n), qs(n), pc(n), qc(n) are adjusted in such a manner that a peak value of a voltage induced in the detection coil 32, 33 changes sinusoidally when the detection object 2 moves at a constant speed relative to the substrate 3, 3A while facing a part of the substrate 3, 3A.

According to the second feature, in the position detection device 1 as described by the first feature, the excitation coil 31 has a rectangular shape with the moving direction of the moving member 13 being a long side direction, and the detection coil 32, 33 is formed inside the rectangular shape, and the magnetic field generated by the excitation coil 31 generates eddy currents in the detection object 2, 2A, wherein an intensity of the magnetic field in a portion of the substrate 3, 3A facing the detection object 2, 2A is weaker than an intensity of the magnetic field in a portion not facing the detection object 2, 2A, and the intensity of the magnetic field in the portion facing the detection object 2, 2A is weaker in a center of a short side direction of the rectangular shape than in both ends of the short side direction, and wherein the coefficients ps(n), qs(n), pc(n), qc(n) are adjusted to mitigate an effect of non-uniformity of the intensity of the magnetic field in the short side direction in the portion of the substrate 3, 3A facing the detection object 2, 2A on the peak value of the voltage induced in the detection coil 32, 33.

According to the third feature, in the position detection device 1 as described by the second feature, the excitation coil 31 has a pair of long side portions 311, 312 which form long sides of the rectangular shape, and a distance between each of the pair of long side portions 311, 312 and the detection coil 32, 33 in the short side direction is wider than a width of the detection coil 32, 33 in the short side direction.

According to the fourth feature, in the position detection device 1 as described by any one of the first to third features, the detection coil 32, 33 is composed of two detection coils provided on the substrate 3, 3A, and phases of the voltages induced in the respective two detection coils 32, 33 while the moving member 13 moves from one moving end to the other moving end are different from each other.

According to the fifth feature, in the position detection device 1 as described by the first feature, the moving member 13 is a rack shaft 13 of a steering device 10 of a vehicle.

Although the embodiment and modified example of the present invention has been described above, the embodiment and modified example described above do not limit the invention according to the scope of claims. Also, it should be noted that not all combinations of features described in the embodiment and modified example are essential to the means for solving the problems of the invention. In addition, the invention can be implemented by modifying it as appropriate to the extent that it does not depart from the gist of the invention, for example, it can be implemented by the following modifications.

In the above embodiment, the case where the target 2 as the detection object is made of a material with higher electrical conductivity than the rack shaft 13 is described, but it is not limited to this case. For example, the detection object may be made of a magnetic material with higher magnetic permeability than the rack shaft 13. In this case, the magnetic flux is concentrated in the detection object and the position of the detection object relative to the substrate 3 can be detected because the magnetic flux density in the portion of the substrate 3 facing the detection object is higher than in other portions. Although the intensity of the magnetic field in the portion facing the detection object can be higher in the center than at both ends in the short side direction of the excitation coil 31, the effect of this non-uniformity of the magnetic flux density on the peak values of the voltage induced in the sine wave-shaped detection coil 32 and the cosine wave-shaped detection coil 33 can be mitigated by using the sine wave-shaped detection coil 32 and the cosine wave-shaped detection coil 33 with shapes in which the coefficients ps(n), qs(n), pc(n), qc(n) are adjusted.

In the above modified example, the case in which the sine wave-shaped detection coil 32 and the cosine wave-shaped detection coil 33 are applied as detection coils for the substrate 3A having the dimensional relationship of $S_1$, $S_2 > W_{32}$, $W_{33}$ is explained, but these sine wave-shaped detection coil 32 and cosine wave-shaped detection coil 33 may be replaced with a normal sine wave-shaped detection coil 32A and a normal cosine wave-shaped detection coil 33A with shapes consisting of only fundamental wave component without harmonic component. Even in this case, the position of the rack shaft 13 can be detected with high accuracy, by having the dimensional relationship of $S_1$, $S_2 > W_{32}$, $W_{33}$, as compared to the case without the dimensional relationship of $S_1$, $S_2 > W_{32}$, $W_{33}$, since the normal sine wave-shaped detection coil 32A and the normal cosine wave-shaped detection coil 33A should be formed near the center where the uniformity of magnetic flux density in the shortitudinal direction of the substrate 3A is high.

The invention claimed is:

1. A position detection device for detecting a position of a moving member moving forward and backward in a predetermined moving direction, comprising:
   a detection object attached to the moving member;
   a substrate provided with an excitation coil for generating a magnetic field in an area including the detection object, and a detection coil being interlinked with a magnetic flux of the magnetic field;
   a power supply unit for supplying an alternating current to the excitation coil; and
   a calculation unit that calculates the position of the moving member based on an output voltage of the detection coil,
   wherein the detection coil is shaped as a combination of a pair of curved portions that are symmetrical across a symmetry axis parallel to the moving direction of the moving member,
   wherein each of the curved portions is shaped as a sinusoidal fundamental wave component superimposed with a harmonic component of a third or higher order multiplied by each of coefficients corresponding to the order, and
   wherein the coefficients are adjusted in such a manner that a peak value of a voltage induced in the detection coil changes sinusoidally when the detection object moves at a constant speed relative to the substrate while facing a part of the substrate.

2. The position detection device, according to claim 1, wherein the excitation coil comprises a rectangular shape with the moving direction of the moving member being a long side direction, and the detection coil is formed inside the rectangular shape,
   wherein the magnetic field generated by the excitation coil generates eddy currents in the detection object,
   wherein an intensity of the magnetic field in a portion of the substrate facing the detection object is weaker than an intensity of the magnetic field in a portion not facing the detection object, and the intensity of the magnetic field in the portion facing the detection object is weaker in a center of a short side direction of the rectangular shape than in both ends of the short side direction, and wherein the coefficients are adjusted to mitigate an effect of non-uniformity of the intensity of the magnetic field in the short side direction in the portion of the substrate facing the detection object on the peak value of the voltage induced in the detection coil.

3. The position detection device, according to claim 2, wherein the excitation coil comprises a pair of long side portions which form long sides of the rectangular shape, and
wherein a distance between each of the pair of long side portions and the detection coil in the short side direction is wider than a width of the detection coil in the short side direction.

4. The position detection device, according to claim 1, wherein the detection coil comprises two detection coils provided on the substrate, and phases of the voltages induced in the respective two detection coils while the moving member moves from one moving end to the other moving end are different from each other.

5. The position detection device, according to claim 1, wherein the moving member is a rack shaft of a steering device of a vehicle.

* * * * *